(12) United States Patent
Ketterson et al.

(10) Patent No.: US 10,553,782 B2
(45) Date of Patent: Feb. 4, 2020

(54) PASSIVE MAGNETIC DEVICES

(71) Applicant: Qorvo US, Inc., Greensboro, NC (US)

(72) Inventors: Andrew Arthur Ketterson, Dallas, TX (US); Xing Gu, Allen, TX (US); Yongjie Cui, Plano, TX (US); Xing Chen, Plainfield, IL (US)

(73) Assignee: Qorvo US, Inc., Greensboro, NC (US)

( * ) Notice: Subject to any disclaimer, the term of this patent is extended or adjusted under 35 U.S.C. 154(b) by 7 days.

(21) Appl. No.: 15/901,142

(22) Filed: Feb. 21, 2018

(65) Prior Publication Data

US 2018/0240963 A1    Aug. 23, 2018

Related U.S. Application Data

(60) Provisional application No. 62/461,344, filed on Feb. 21, 2017.

(51) Int. Cl.
| | | |
|---|---|---|
| *H01L 43/02* | (2006.01) |
| *H01P 1/38* | (2006.01) |
| *H04B 7/02* | (2018.01) |
| *H01F 1/01* | (2006.01) |
| *H01P 1/36* | (2006.01) |

(52) U.S. Cl.
CPC ............ *H01L 43/02* (2013.01); *H01F 1/015* (2013.01); *H01P 1/36* (2013.01); *H01P 1/38* (2013.01); *H04B 7/02* (2013.01)

(58) Field of Classification Search
CPC . H01L 43/02; H01F 1/015; H01F 1/22; H01F 1/36; H01F 3/08; H01P 1/36; H01P 1/38; H01P 1/387; H04B 7/02
USPC ........................................................ 257/431
See application file for complete search history.

(56) References Cited

U.S. PATENT DOCUMENTS

| | | | |
|---|---|---|---|
| 6,051,839 A * | 4/2000 | Crewe ................ | H01J 37/1416 250/311 |
| 9,613,831 B2 | 4/2017 | Morris et al. | |
| 2017/0334710 A1 | 11/2017 | Costa et al. | |

* cited by examiner

*Primary Examiner* — Hrayr A Sayadian
(74) *Attorney, Agent, or Firm* — Withrop & Terranova, P.L.L.C.

(57) ABSTRACT

A passive magnetic device (PMD) has a base electrode, a multi-port signal structure (MPSS), and a substrate therebetween. The MPSS has a central plate residing in a second plane and at least two port tabs spaced apart from one another and extending from the central plate. The substrate has a central portion that defines a mesh structure between the base electrode and the central plate of the multi-port signal structure. A plurality of magnetic pillars are provided within the mesh structure, wherein each of the plurality of the magnetic pillars are spaced apart from one another and surrounded by a corresponding portion of the mesh structure. The PMD may provide a magnetically self-biased device that may be used as a radio frequency (RF) circulator, an RF isolator, and the like.

13 Claims, 4 Drawing Sheets

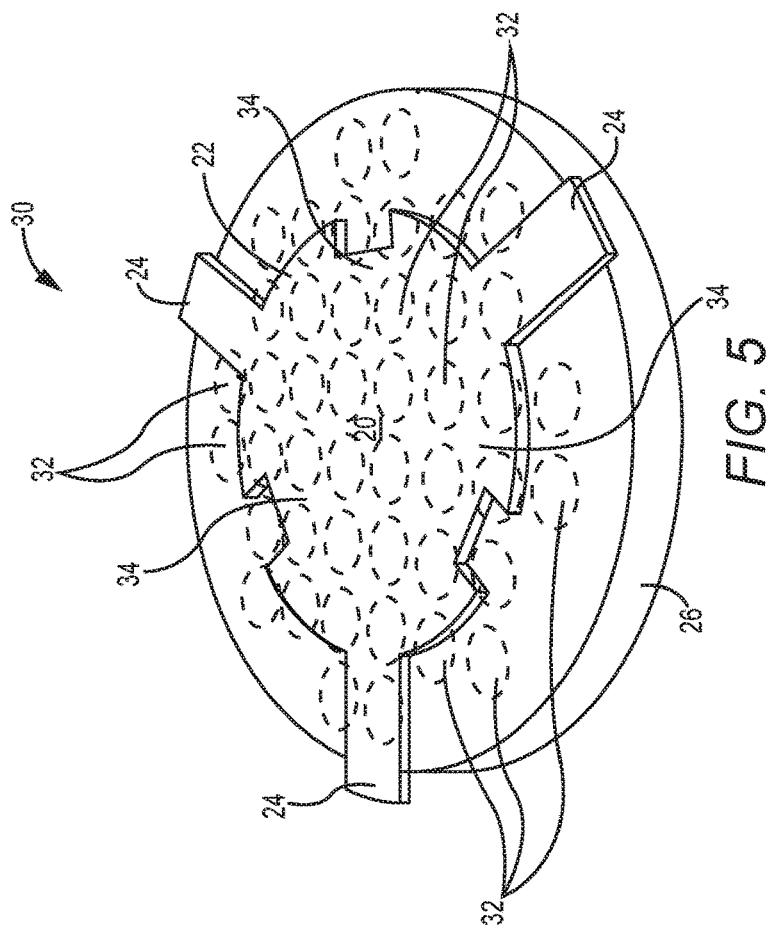
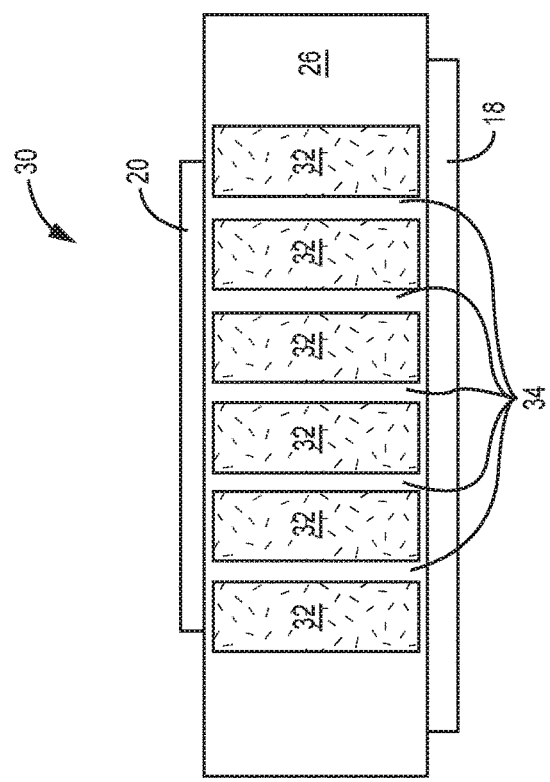
FIG. 5
FIG. 4

PASSIVE MAGNETIC DEVICES

RELATED APPLICATIONS

This application claims the benefit of provisional patent application Ser. No. 62/461,344, filed Feb. 21, 2017, the disclosure of which is hereby incorporated herein by reference in its entirety.

GOVERNMENT SUPPORT

This invention was made under CRADA No. 16063-85C16 between TriQuint Semiconductor, Inc. and Argonne National Laboratory operated for the United States Department of Energy. The Government has certain rights in this invention.

FIELD OF THE DISCLOSURE

The present disclosure relates to passive magnetic devices, such as radio frequency circulators and isolators.

BACKGROUND

Radio frequency (RF) isolators and RF circulators are exemplary passive magnetic (or ferromagnetic) devices (PMDs), which are used in many RF communication systems to passively control the flow of electrical signals in these systems. The PMDs are constructed to have magnetic fields that are rotary in nature and act to guide electrical signals to follow the magnetic fields such that RF signals flow from one port to an adjacent port in only one direction (i.e clockwise or counterclockwise). An RF isolator is a PMD that is used to pass signals from a first port to a second port with little loss and redirection reflections at the second port to a third port, which is terminated in a desired manner, instead of allowing them to be reflected back to the first port. An RF circulator is a PMD that is used to only pass signals presented at the first port to a second port and only pass signals presented at the second port to the third port.

An exemplary RF circulator application of a PMD 10 is provided in FIG. 1. The PMD 10 is coupled to a transmitter 12 via port P1, a receiver 14 via port P2, and an antenna 16 via port P3. In this example, the dashed arrow within the body of the PMD 10 indicates the forced direction of signal flow between the ports P1, P2, and P3. In particular, RF signals will flow clockwise from port P1 to port P3, from port P3 to port P2, and from port P2 to port P1 due to the magnetic fields provided by the PMD 10. The RF signals will not flow in the reverse direction (i.e. counter-clockwise) from port P1 to port P2, from port P2 to port P3, or from port P3 to port P1 due to the same magnetic fields.

When the transmitter 12 transmits an RF transmit signal (TX SIGNAL), the RF transmit signal is passed directly from port P1 to port P3, which is coupled to the antenna 16, through the PMD 10. The RF transmit signal will not pass from port P1 to port P2, which is coupled to the receiver 14, through the PMD 10. Similarly, when the antenna receives an RF receive signal (RX SIGNAL), the RF receive signal is presented to port P3 and passed directly from port P3 to port P2, which is coupled to the receiver 14, through the PMD 10. The RF receive signal will not pass from port P3 to port P1, which is coupled to the transmitter 12. Those skilled in the art will recognize that the application of FIG. 1 is merely exemplary and that signal flow may be directed in a counter-clockwise direction in the PMD 10, as well as that the PMDs 10 may be implemented in a variety of applications.

SUMMARY

In a first embodiment, a passive magnetic device (PMD) has a base electrode, a multi-port signal structure (MPSS), and a substrate therebetween. The MPSS has a central plate residing in a second plane and at least two port tabs spaced apart from one another and extending from the central plate. The substrate has a central portion that defines a mesh structure between the base electrode and the central plate of the multi-port signal structure. A plurality of magnetic pillars are provided within the mesh structure, wherein each of the plurality of the magnetic pillars are spaced apart from one another and surrounded by a corresponding portion of the mesh structure. The PMD may provide a magnetically self-biased device that may be used as a radio frequency (RF) circulator, an RF isolator, and the like.

In one embodiment, the substrate and the central portion that defines the mesh structure is formed from silicon carbide, silicon, aluminum nitride, diamond, and the like. The plurality of magnetic pillars may include iron, nickel, cobalt, iron carbonate, an iron carbonate alloy, iron nickel, iron nickel alloy, magnetic nanoparticles, and the like.

In one embodiment, the plurality of magnetic pillars is formed from a first material, the mesh structure is formed from a second material, and the thermal conductivity of the second material is at least five to ten times greater than the thermal conductivity of the first material. The substrate may also be formed from the second material.

In one embodiment, the substrate and the central portion that defines the mesh structure are formed from silicon carbide; the plurality of magnetic pillars is formed from a first material; and the thermal conductivity of the silicon carbide is at least two times greater than the thermal conductivity of the first material.

The plurality of magnetic pillars may take on virtually any shape, including columnar-shaped and may have a nominal diameter of less than 100 micrometers. In certain embodiments, there are at least nine magnetic pillars. Further, a volume of the plurality of magnetic pillars is generally, but not necessarily, greater than a volume of the magnetic mesh structure.

In an alternative embodiment, the passive magnetic device has a base electrode, an MPSS, and a substrate therebetween. The MPSS comprises a central plate and at least two port tabs spaced apart from one another and extending from the central plate. The substrate has an outer portion and a magnetic central portion within the outer portion and defining a magnetic mesh structure between the base electrode and the central plate of the MPSS. A plurality of non-magnetic pillars are provided within the magnetic mesh structure, wherein each of the plurality of the non-magnetic pillars are spaced apart from one another and surrounded by a corresponding portion of the magnetic mesh structure.

In one embodiment, the plurality of non-metallic pillars and the outer portion that defines the mesh structure are formed from silicon carbide, silicon, aluminum nitride, diamond, and the like.

In one embodiment, the magnetic mesh structure comprises at least one of the group consisting of iron, nickel, cobalt, iron carbonate, an iron carbonate alloy, iron nickel, an iron nickel alloy, magnetic nanoparticles, and the like.

In one embodiment, the magnetic mesh structure is formed from a first material, the plurality of non-magnetic pillars is formed from a second material, and the thermal conductivity of the second material is at least five to ten times greater than the thermal conductivity of the first material. The outer portion may also be formed from the second material.

In one embodiment, the magnetic mesh structure is formed from a first material; the plurality of non-magnetic pillars and the substrate are formed from silicon carbide; and the thermal conductivity of the silicon carbide is at least five to ten times greater than the thermal conductivity of the first material. Each of the plurality of non-magnetic pillars may take on any shape, including but not limited to columnar-shaped, and may have a nominal diameter of less than 100 micrometers. There are generally, but not necessarily, at least nine magnetic pillars.

In one embodiment, the volume of the plurality of non-magnetic pillars is less than the volume of the magnetic mesh structure.

In one embodiment, the outer portion is formed from a non-magnetic material. For example, the non-magnetic mesh structure may be integrally formed with the substrate of a common material, wherein the outer portion is formed from a first material, and the plurality of non-magnetic pillars are formed from the first material.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 is a cross-sectional view of a passive magnetic device according to a first embodiment of the disclosure.

FIG. 5 is an isometric view of the passive magnetic device of FIG. 4.

DETAILED DESCRIPTION

Figure 1:
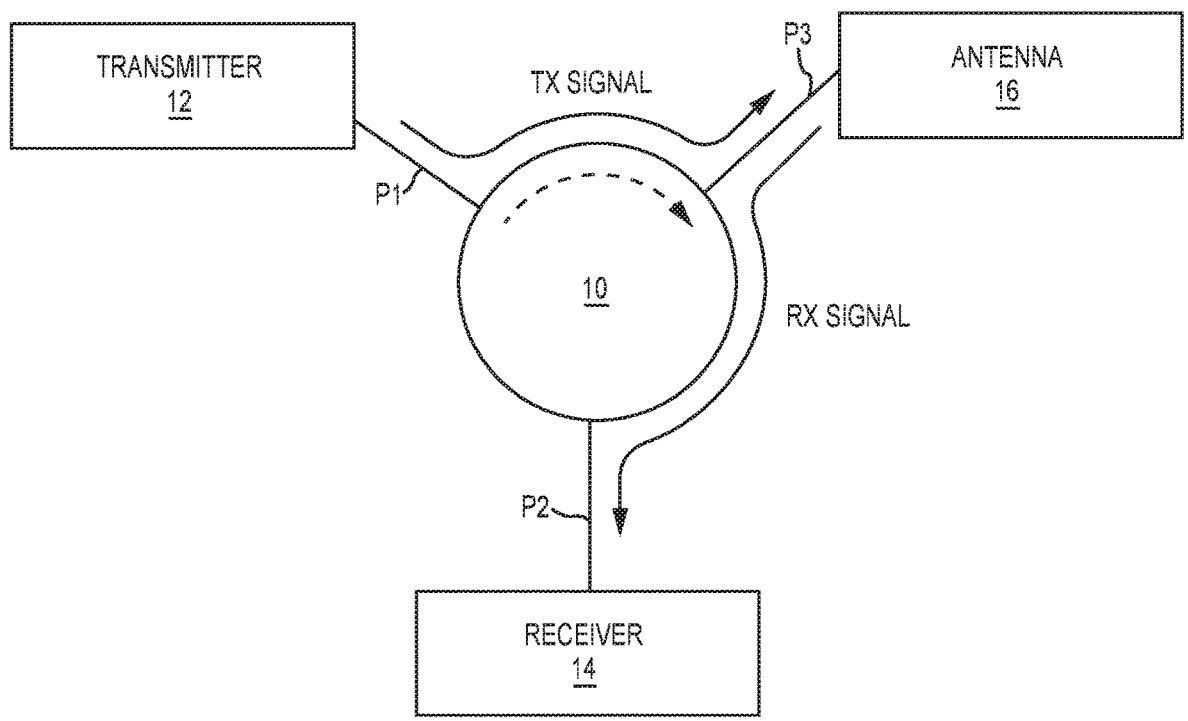
FIG. 1 is a schematic diagram of a passive magnetic device, which is configured as a circulator, employed in a transceiver architecture.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
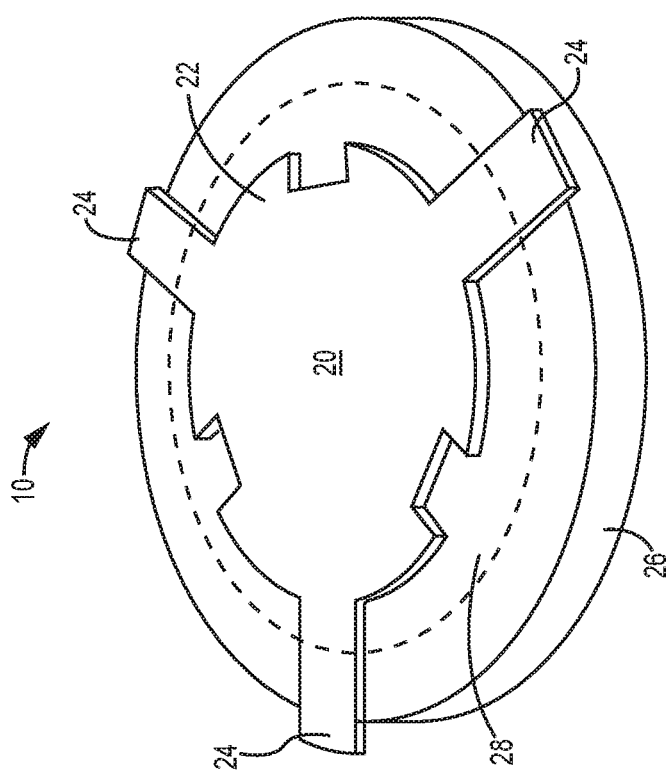
FIG. 3 is an isometric view of the passive magnetic device of FIG. 2.
Figure 2:
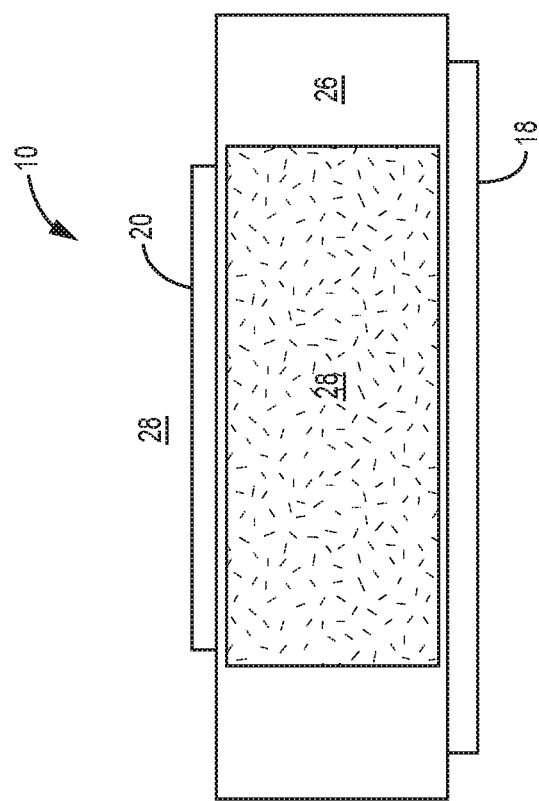
FIG. 2 is a cross-sectional view of a passive magnetic device according to the related art.

FIGS. 2 and 3 illustrate cross-sectional and isometric views for a state of the art PMD 10. The PMD 10 illustrated includes a base electrode 18 and a multi-port signal structure (MPSS) 20, which includes a central plate 22 and multiple port tabs 24 that extend from the central plate 22. Typical isolator and circulator structures include three port tabs 24, but other devices may have two or four or more port tabs 24. A substrate 26 resides between the base electrode 18 and the MPSS 20, wherein the base electrode 18 resides on a bottom surface of the substrate 26, and the MPSS 20 resides on a top surface of the substrate 26. A puck-shaped magnetic core 28 is formed in the substrate 26 between the base electrode 18 and the MPSS 20.

The dashed line in FIG. 3 represents the perimeter of the magnetic core 28. The magnetic core 28 is typically formed from a ferrite material; however, these ferrite materials have drawbacks. For example, a ferrite-based circulator thermal drift will limit average power handling. Ferrite materials are generally poor thermal conductors. During operation, the magnetic core 28 will absorb heat due to insertion losses, and since the ferrite materials are poor thermal conductors, it is difficult for the heat to escape the magnetic core 28. As the temperature of the magnetic core 28 increases, the magnetization associated with the PMD 10 will change, and as such, the magnetic fields associated with the PMD 10 will vary. The variation of the magnetic fields leads to performance degradations. Accordingly, there is a need to improve the thermal performance of the PMDs 10 to improve the electrical performance of the PMDs 10.

FIGS. 4 and 5 illustrate cross-sectional and isometric views of a PMD 30, which provides an improved magnetic structure that maintains magnetic performance, and thus electrical performance, while significantly improving thermal performance. As described above, the PMD 30 includes a substrate 26 that has a base electrode 18 on the bottom surface of the substrate 26, and an MPSS 20 on the top surface of the substrate 26. However, the magnetic core 28 has been replaced with an array of magnetic pillars 32, which are surrounded by a mesh structure 34, which is integrally formed within, or is part of, the substrate 26. Each of the magnetic pillars 32 is effectively surrounded by a corresponding portion of the mesh structure 34. The mesh structure 34 is formed from a material with good thermal conductivity.

In one embodiment, the thermal conductivity of the material used to form the mesh structure 34 has a thermal conductivity of 300 W/m-K or greater. In general, a material that has high thermal conductivity is defined as one with a thermal conductivity of 50 W/m-K or greater. When the mesh structure 34 is an integral part of the substrate 26, the mesh structure 34 and the substrate 26 are formed from the same material. One material that provides good thermal performance is silicon carbide (SiC). Other materials with good thermal conductivity that may be used to form the mesh structure 34 and the substrate 26 include, but are not limited to insulating diamond, silicon, aluminum nitride, polymers with high thermal conductivity, beryllium oxide, aluminum oxide, and the like.

In one embodiment, the mesh structure 34 has a thermal conductivity at least two times greater than the thermal conductivity used to form the magnetic pillars 32. The magnetic pillars 32 may be formed from various materials, and in many cases from ferrite materials. Exemplary materials include iron, nickel, cobalt, iron carbonate, iron carbonate alloys, iron nickel, iron nickel alloys, sintered powders, and the like. Those skilled in the art will recognize additional magnetic materials that may be used to form the magnetic pillars 32. Further, these materials may range from nanoparticles to polymer-based paste, with magnetic particles of virtually any size residing therein. Further, the paste used to form the magnetic pillars may include polymers that are thermally conductive.

In many instances, the mesh structure 34 electrically insulates the magnetic pillars 32 from each other, as well as from the base electrode 18 and the MPSS 20. As such, a thin layer of substrate or other materials may reside between the tops of the magnetic pillars 32 and the MPSS 20, as well as between the bottoms of the magnetic pillars 32 and the base electrode 18. Further information on thermally conductive polymers may be found in U.S. Pat. No. 9,613,831 and in U.S. patent application Ser. No. 15/601,858 filed May 22, 2017, which are incorporated herein by reference in their entireties and are co-owned by Qorvo US, Inc. of Greensboro, N.C.

Having the mesh structure 34 distributed around the magnetic pillars 32 allows the heat generated in the magnetic pillars 32 to flow out of the PMD 30 via the mesh structure 34. This construction greatly enhances the thermal management capability of the PMD 30 and allows the PMD 30 to handle more power, perform consistently, and be more reliable. The magnetic pillars 32 are shown as being perfectly cylindrical, or columnar, but they may take any shape. Further, the magnetic pillars 32 do not need to be all a common shape or have a uniform shape or spacing.

In certain embodiments, the thickness of the substrate 26 and the magnetic pillars 32 can range from 5 µm to 500 µm. The nominal (i.e. average) diameters for the magnetic pillars 32, regardless of actual shape, may range from 25 µm to 100 µm, in certain embodiments. These measurements are provided merely for exemplary purposes, and should not be construed as limitations on the concepts provided herein. Further, the mesh structure 34 and the magnetic pillars 32 will collectively form the magnetic portion of the substrate 26. The magnetic portion with be associated with a volume. The magnetic pillars 32 may take up a majority of the volume, wherein the mesh structure 34 may take up a minority of the volume. For example, the magnetic pillars 32 may collectively take up 90% of the volume, while the remaining 10% of the volume is taken up by the mesh structure 34. The magnetic pillars 32 may take up 50-95% of the volume in a first embodiment, wherein the mesh structure 34 takes up the rest. The magnetic pillars 32 may take up 60-80% of the volume in a second embodiment, wherein the mesh structure 34 takes up the rest. The magnetic pillars 32 may take up 70-90% of the volume in a third embodiment, wherein the mesh structure 34 takes up the rest. Again, these are exemplary, non-limiting embodiments.

To form the PMD 30 of FIGS. 4 and 5, a dielectric substrate 26 with good thermal conductivity, such as silicon carbide, is provided. The substrate 26 is thinned down to a target thickness, such as 200 µm, using a grinding or other appropriate thinning process. The thinned substrate 26 is then subjected to an appropriate etching, micro etching, drilling, or like process to form multiple micro cavities. Next, the micro cavities are filled with appropriate magnetic materials. Depending on the materials, the magnetic materials may be pressed into the micro cavities, wherein the exposed portions are smoothed. An additional layer of the substrate may be provided over the thinned substrate, wherein the MPSS 20 is then provided either directly over the mesh structure 34 and magnetic pillars 32, or over the layer provided above the mesh structure 34 and the magnetic pillars 32. The base electrode 18 is then formed on the bottom surface of the substrate 26, if it is not already in place. The resulting device will preferably possess a strong self-biased magnetic field, which is suitable for the designated operational frequency of the PMD 30, without needing external magnetic bias. The self-biased field will typically be at least 1000 Oe.

Figure 7:
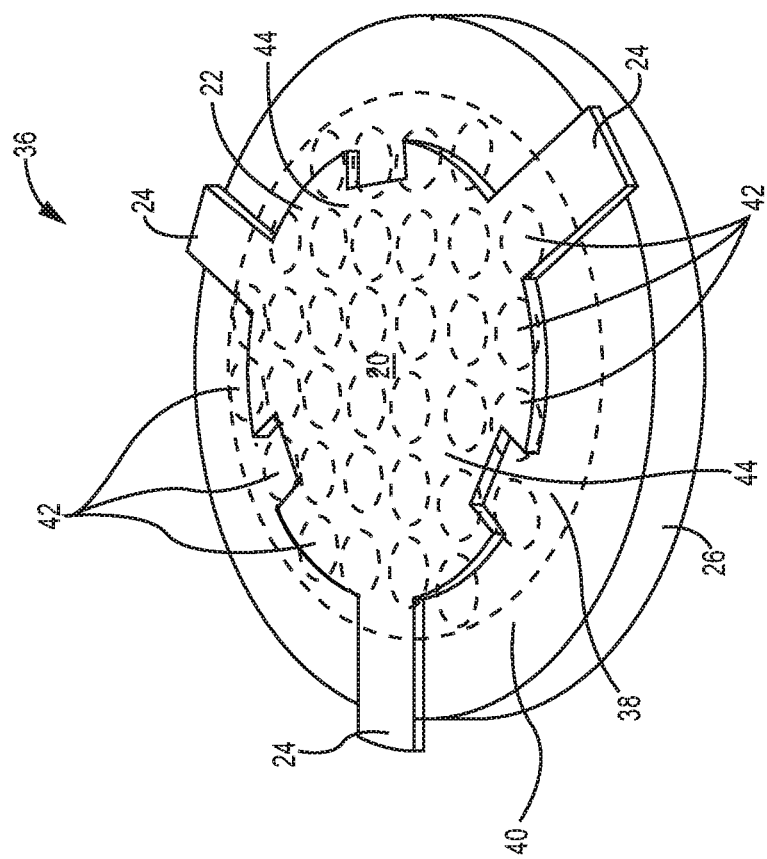
FIG. 7 is an isometric view of the passive magnetic device of FIG. 6.
Figure 6:
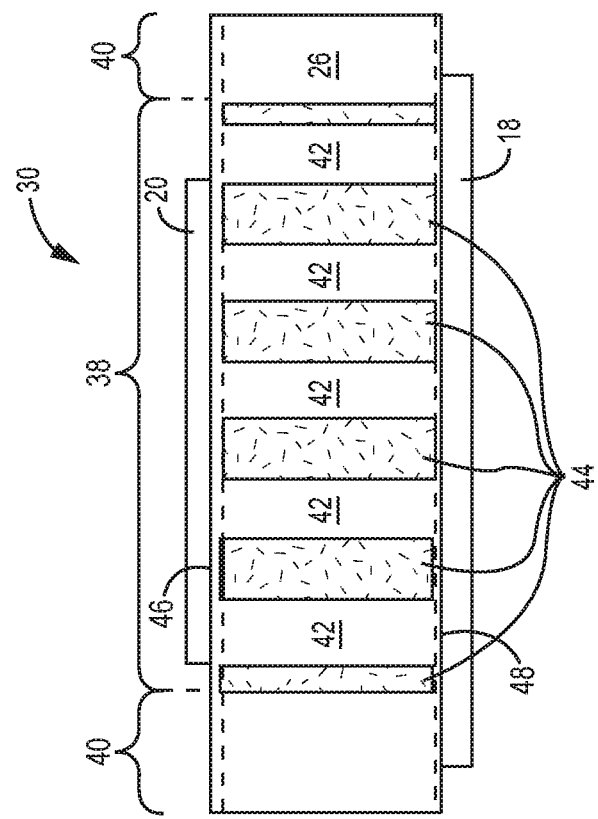
FIG. 6 is a cross-sectional view of a passive magnetic device according to a second embodiment of the disclosure.

Turning now to FIGS. 6 and 7, an alternative PMD 36 is illustrated. The difference between the PMD 36 of FIGS. 6 and 7 and the PMD 30 of FIGS. 4 and 5 is that the mesh structure 34 and the magnetic pillars 32 are effectively reversed. In other words, the PMD 36 includes non-magnetic pillars 42 (as opposed to magnetic pillars 32) and a magnetic mesh structure 44 (as opposed to a non-magnetic mesh structure 34). The non-magnetic pillars 42 may be formed from the same material as the substrate 26 and be formed as an integral part of the substrate 26. The magnetic mesh structure 44 will be formed from an appropriate magnetic material.

In this configuration, the requisite magnetic fields required for the PMD 36 are provided by the magnetic mesh structure 44. Further, the heat generated in the magnetic mesh structure 44 is dissipated out of the PMD 36 via the non-magnetic pillars 42. If the non-magnetic pillars 42 are an integral part of the substrate 26, a micro etching process may be used to effectively etch away the portion of the substrate 26 that will become the magnetic mesh structure 44. That area will then be filled with the magnetic material in a manner similar to that described above for the formation of the magnetic pillars 32.

If the non-magnetic pillars 42 are not an integral part of the substrate 26, a disc-shaped void may be formed in the substrate 26 and then filled by the magnetic material that will be used for the magnetic mesh structure 44. The magnetic mesh structure 44 may be etched to form voids where the non-magnetic pillars 42 will reside. At that point, the material for the non-magnetic pillars 42 will be placed in those voids and processed as needed to form the structures illustrated in FIGS. 6 and 7. The shapes and sizes of the non-magnetic pillars 42 and the magnetic mesh structure 44 may be configured such that the ratios of the magnetic mesh structure 44 and the non-magnetic material of the non-magnetic pillars 42 correspond to magnetic and non-magnetic sections described above. In particular, the magnetic mesh structure 44 takes up a majority of the volume associated with the combination of the magnetic mesh structure 44 and the non-magnetic pillars 42. The other ratios described above apply in this embodiment as well.

As illustrated, a top layer 46 and a bottom layer 48 may be provided on either side of the magnetic mesh structure 44 and the non-magnetic pillars 42 and be formed from a variety of materials. In certain embodiments, these top and bottom layers 46, 48 are formed from the same material as the outer portion 40 of the substrate 26 and the magnetic pillars 42. In other embodiments, the top and bottom layers 46, 48 may be formed from other dielectric materials, perhaps with high thermal conductivity.

Those skilled in the art will recognize improvements and modifications to the preferred embodiments of the present disclosure. All such improvements and modifications are considered within the scope of the concepts disclosed herein and the claims that follow.

What is claimed is:

1. A passive magnetic device comprising:
   a base electrode;
   multi-port signal structure comprising a central plate and at least two port tabs spaced apart from one another and extending from the central plate;
   a substrate having a central portion that defines a mesh structure between the base electrode and the central plate of the multi-port signal structure; and
   a plurality of magnetic pillars within the mesh structure, wherein the plurality of magnetic pillars are spaced apart from one another and surrounded by a corresponding portion of the mesh structure.

2. The passive magnetic device of claim 1 wherein the substrate and the central portion that defines the mesh structure are formed from silicon carbide.

3. The passive magnetic device of claim 1 wherein the substrate and the central portion that defines the mesh structure are formed from at least one of a group consisting of aluminum nitride and diamond.

4. The passive magnetic device of claim 1 wherein the plurality of magnetic pillars comprises at least one of a group consisting of iron, nickel, and cobalt.

5. The passive magnetic device of claim 1 wherein the plurality of magnetic pillars comprises iron.

6. The passive magnetic device of claim 1 wherein the plurality of magnetic pillars is formed from one of a group consisting of iron carbonate, an iron carbonate alloy, iron nickel, and an iron nickel alloy.

7. The passive magnetic device of claim 1 wherein the plurality of magnetic pillars comprise magnetic nanoparticles.

8. The passive magnetic device of claim 1 wherein the plurality of magnetic pillars is formed from a first material, the mesh structure is formed from a second material, and a thermal conductivity of the second material is at least five times greater than a thermal conductivity of the first material.

9. The passive magnetic device of claim 8 wherein the substrate is formed from the second material.

10. The passive magnetic device of claim 1 wherein:
    the substrate and the central portion that defines the mesh structure are formed from silicon carbide; and
    the plurality of magnetic pillars is formed from a first material; and
    a thermal conductivity of the silicon carbide is at least five times greater than a thermal conductivity of the first material.

11. The passive magnetic device of claim 1 wherein each of the plurality of magnetic pillars are columnar-shaped and have a nominal diameter of less than 100 micrometers.

12. The passive magnetic device of claim 1 wherein the plurality of magnetic pillars comprises at least nine magnetic pillars.

13. The passive magnetic device of claim 1 wherein a volume of the plurality of magnetic pillars is greater than a volume of the mesh structure.

* * * * *